United States Patent
Wang et al.

(10) Patent No.: US 9,070,689 B2
(45) Date of Patent: Jun. 30, 2015

(54) STRUCTURE FOR INTERCONNECTING COPPER WITH LOW DIELECTRIC CONSTANT MEDIUM AND THE INTEGRATION METHOD THEREOF

(75) Inventors: Pengfei Wang, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/381,182

(22) PCT Filed: Apr. 8, 2011

(86) PCT No.: PCT/CN2011/000609
§ 371 (c)(1),
(2), (4) Date: Dec. 28, 2011

(87) PCT Pub. No.: WO2012/048509
PCT Pub. Date: Apr. 19, 2012

(65) Prior Publication Data
US 2013/0187278 A1    Jul. 25, 2013

(30) Foreign Application Priority Data
Oct. 15, 2010   (CN) .......................... 2010 1 0508184

(51) Int. Cl.
*H01L 23/535*  (2006.01)
*H01L 21/768*  (2006.01)
*H01L 23/532*  (2006.01)

(52) U.S. Cl.
CPC .......... *H01L 23/535* (2013.01); *H01L 21/7682* (2013.01); *H01L 23/53238* (2013.01); *H01L 23/53295* (2013.01); *H01L 23/53266* (2013.01); *H01L 23/5329* (2013.01); *H01L 2924/0002* (2013.01)

(58) Field of Classification Search
USPC ............ 257/522, E23.013, E21.581; 438/619
See application file for complete search history.

(56) References Cited

U.S. PATENT DOCUMENTS

| | | | | |
|---|---|---|---|---|
| 6,078,088 A | * | 6/2000 | Buynoski | 257/410 |
| 6,177,329 B1 | * | 1/2001 | Pang | 438/400 |
| 6,184,121 B1 | * | 2/2001 | Buchwalter et al. | 438/622 |
| 6,204,165 B1 | * | 3/2001 | Ghoshal | 438/619 |
| 6,413,852 B1 | * | 7/2002 | Grill et al. | 438/619 |
| 6,713,835 B1 | * | 3/2004 | Horak et al. | 257/522 |
| 7,662,722 B2 | * | 2/2010 | Stamper et al. | 438/719 |
| 8,034,693 B2 | * | 10/2011 | Shibata et al. | 438/422 |
| 2007/0076339 A1 | * | 4/2007 | Lur et al. | 361/56 |
| 2008/0173976 A1 | * | 7/2008 | Stamper et al. | 257/531 |

* cited by examiner

Primary Examiner — Lex Malsawma
(74) Attorney, Agent, or Firm — Collard & Roe, P.C.

(57) ABSTRACT

The present invention belongs to the technical field of semiconductor devices, and discloses a structure for interconnecting a medium of low dielectric constant with copper and the integration method thereof. It includes: using a combination of copper interconnections and air gaps to reduce capacity, and a special structure to support copper conductors so as to maintain the shape of copper conductors after removing the medium. The advantage of the present invention is that it can realize the complete air gap structure without short circuit or disconnection of copper conductors as well as the complete air gap structure with long conductors, thus reducing RC delay.

9 Claims, 3 Drawing Sheets

US 9,070,689 B2

STRUCTURE FOR INTERCONNECTING COPPER WITH LOW DIELECTRIC CONSTANT MEDIUM AND THE INTEGRATION METHOD THEREOF

CROSS REFERENCE TO RELATED APPLICATIONS

This application is the National Stage of PCT/CN2011/000609 filed on Apr. 8, 2011, which claims priority under 35 U.S.C. §119 of Chinese Application No. 201010508184.4 filed on Oct. 15, 2010, the disclosure of which is incorporated by reference. The international application under PCT article 21(2) was not published in English.

BACKGROUND OF THE INVENTION

1. Technical Field

The present invention belongs to the technical field of semiconductor devices, and especially relates to a structure for interconnecting copper with a medium of low dielectric constant and the integration method thereof.

2. Description of the Related Art

With the continuous development of large-scale integrated circuit technology, the feature size of semiconductor devices is reducing constantly and the chip area is increasing gradually. As a result, people are facing the problem of how to address the significant increase of RC (R and C refer to resistance and capacity respectively) delay caused by the rapid increase of wire length. Especially as the influence of the capacity between metal wiring becomes more and more significant and further causes apparent decrease of device performance, it has become a critical factor restricting the further development of the semiconductor industry. Many measures have been taken to reduce the RC delay caused by interconnection.

The distribution capacity and interconnection resistance between interconnections lead to signal transmission delay. Since copper features low resistance, excellent anti-electromigration properties and high reliability, the study on changing routine aluminum interconnections to copper interconnection with low resistance has been carried out so as to decrease the metal interconnection resistance and further to reduce the interconnection delay effect. Decrease of capacity between interconnections can also reduce relay. As the distribution capacity C is directly proportional to the relative dielectric constant K of circuit layer insulation dielectrics, using materials with low K value (K<3) to replace the traditional SiO2 dielectric as the insulator of different circuit layers has become the requirement for high speed chip development. Since the relative dielectric constant of air is 1, it is an ideal insulation medium. Therefore, the air gap between metals can reduce interconnection RC delay effectively.

BRIEF SUMMARY OF THE INVENTION

The present invention aims at providing a structure for interconnecting copper and the integration method of integrating low dielectric constant medium with copper, so as to improve the RC delay and further improve the performance of semiconductor chips.

To achieve the above purpose, a combination of copper interconnections and air gaps for reducing capacitance, and a special structure for supporting copper conductors are used in the present invention so as to maintain the shape of copper conductors after removing the sacrificial dielectric film. The advantage of the present invention is that it can realize the complete air gap structure without short circuit or disconnection of copper conductors as well as the complete air gap structure with long conductors, thus reducing RC delay.

A structure for copper interconnection with a medium of low dielectric constant provided by the present invention includes at least one metal conductor and insulator supporting structures under the metal conductors, wherein holes are configured between the metal conductors and also between the insulator supporting structures.

The metal conductors are copper or tungsten wires or compound conductors made of copper or tungsten and a diffusion barrier layer. The diffusion barrier layer is made of titanium nitride (TiN), or tantalum (Ta) or tungsten nitride (WN). The insulator supporting structure is a columnar or strip structure made of insulation materials, wherein the supporting insulator is under the supported metals to maintain their shape. The insulator material is carbon silicon or polymer. The insulator supporting structure is a columnar or strip structure made of insulation materials.

The present invention also provides an integration method for interconnecting copper with a medium of low dielectric constant, wherein the method includes the following steps:

Provide a semiconductor substrate with microelectronic device manufacturing finished;

Form a first film composed of a first material on the substrate in sequence.

Form a perforation opening in the first film.

Deposit and flatten a second film;

Deposit a third film and open a second opening;

Deposit a fourth film and a fifth film on the third film;

Form a damascene or dual-damascene copper interconnection structure;

Remove the media except the second and third films.

Form a pore structure after removing the media except the second and third films. Also, the second and third films under the supported metals have a supporting effect so as to maintain the shape of the metals.

DETAILED DESCRIPTION OF THE INVENTION

The present invention is further detailed by the embodiments in combination with the drawings as below.

Figure 1:
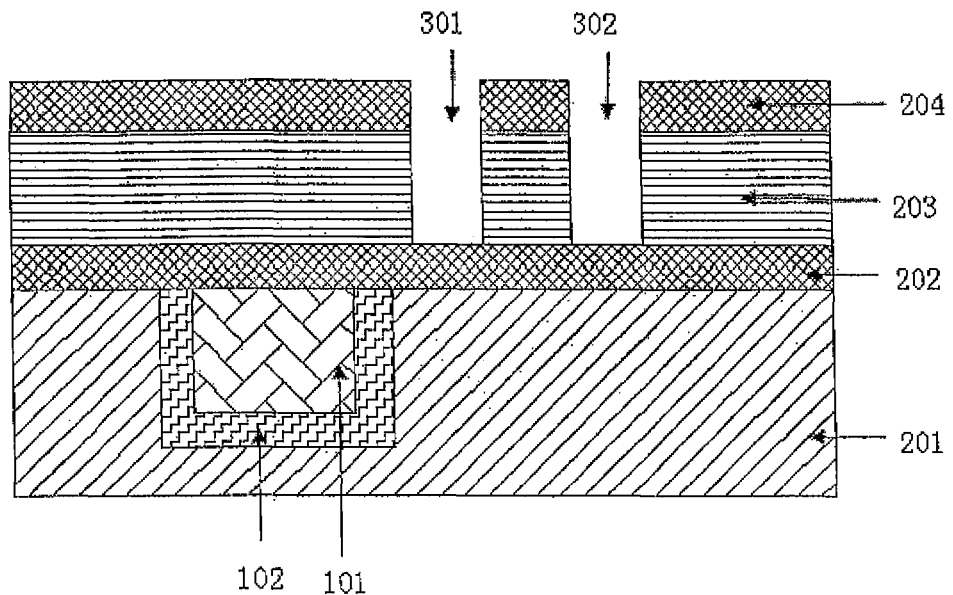
FIGS. 1 to 6 are the sections of the process for an integration method for interconnecting a medium of low dielectric constant with copper according to the present invention.

As shown in FIG. 1, provide a substrate 201 covered with an insulation film 202, wherein the substrate contains a metal conductor 101 and a diffusion barrier layer 102. Then form a first film 203 and a photoresist 204 on the substrate 201, namely the film 202, in sequence. Form openings 301 and 302 on the photoresist 204 and the film 203 by means of lithography and etching technologies, and then remove the photoresist 204. Wherein the material of the metal conductor 101 shall be Cu or tungsten, that of the diffusion barrier layer 102 can be, for example, TiN, and that of the film 203 shall be SiO2.

Figure 2:
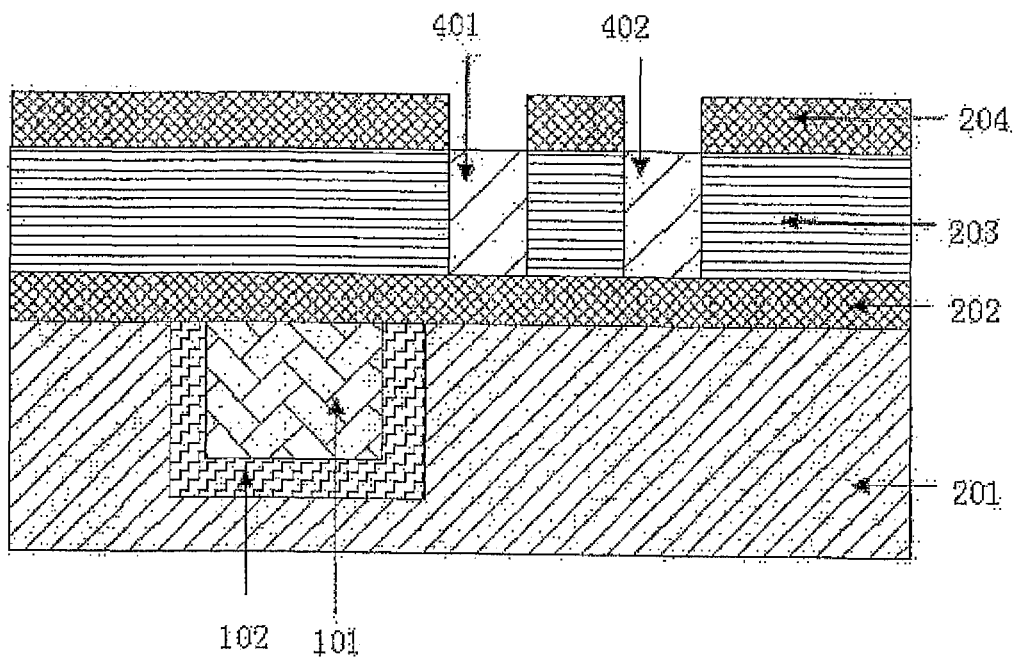

A second film is deposited and flattened in the openings 301 and 302 to form columnar supports 401 and 402, wherein the second film can be carbon silicon (SiC) or polymer materials. Afterwards, etch the SIC film to form a structure shown in FIG. 2.

Figure 3:
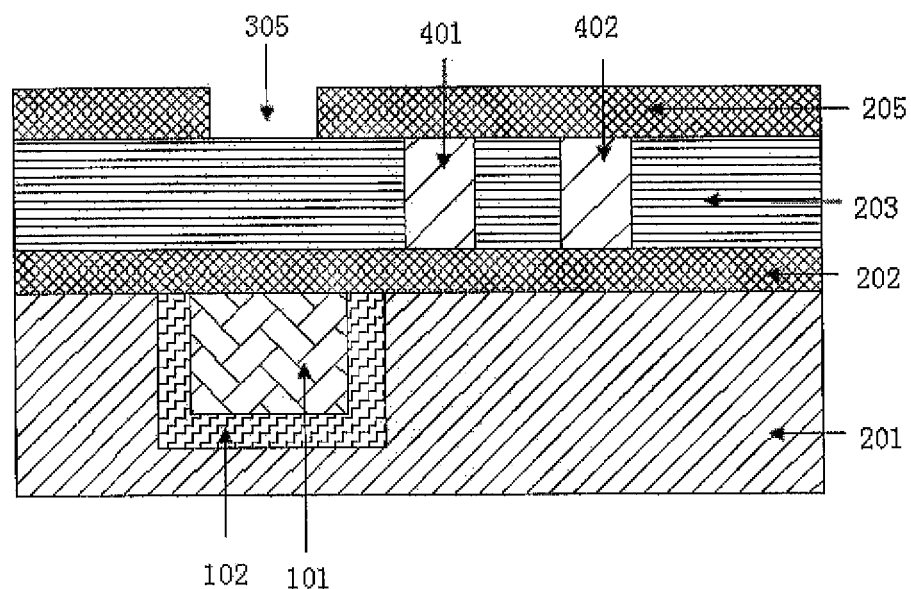

As shown in FIG. 3, remove the film 204 and form a third film 205, which may be Si3N4, on the film 203, form an opening 305 on the film 205 by means of lithography and etching technologies and then remove the photo resist.

Figure 4:
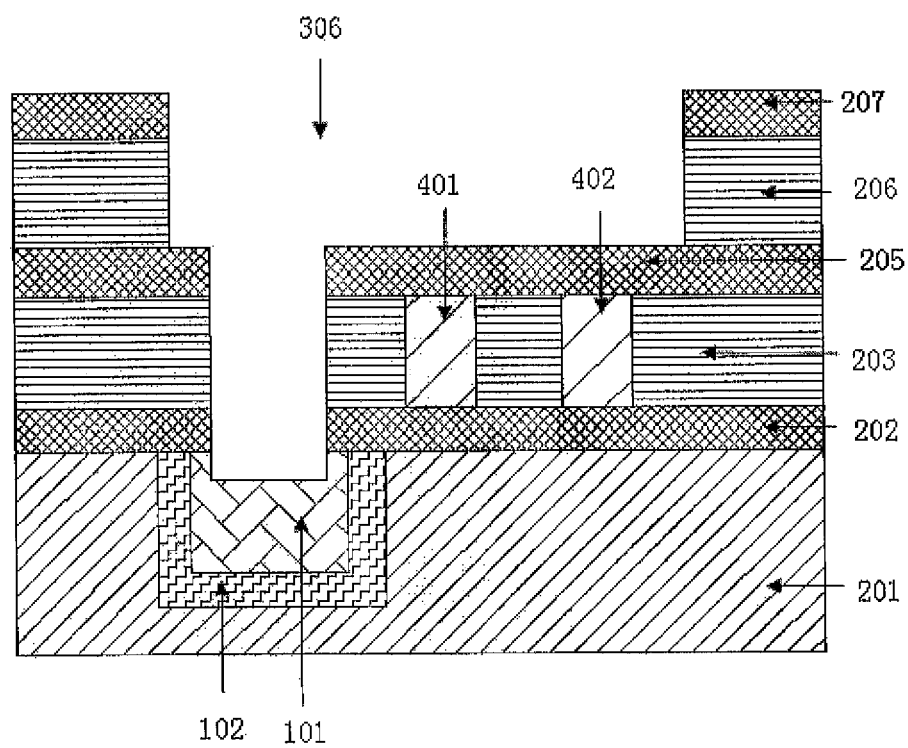

As shown in FIG. 4, form a fourth film 206 and a fifth film 207 on the film 205 in sequence, wherein the films 206 and 207 are SiO2 and Si3N4 respectively, afterwards, form an opening 306 in the films 207, 206, 205, 203 and 202, and then remove the photo resist.

Figure 5:
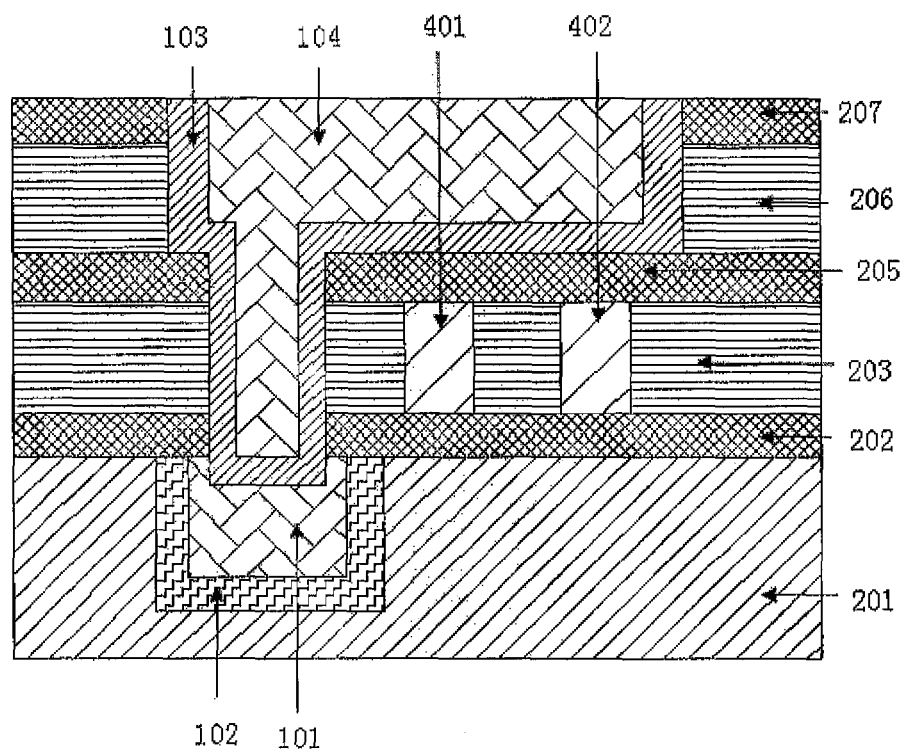

As shown in FIG. 5, form a diffusion barrier layer 103 in the opening 306, bury the metal conductor 104 in the opening 306 by means of plating technology and polish the metal conductor 104 by means of chemical polishing technology, wherein the materials of the diffusion barrier layer 103 and the metal conductor 104 are TiN and Cu respectively. In this way, a damascene or dual-damascene copper interconnection structure is formed.

Figure 6:
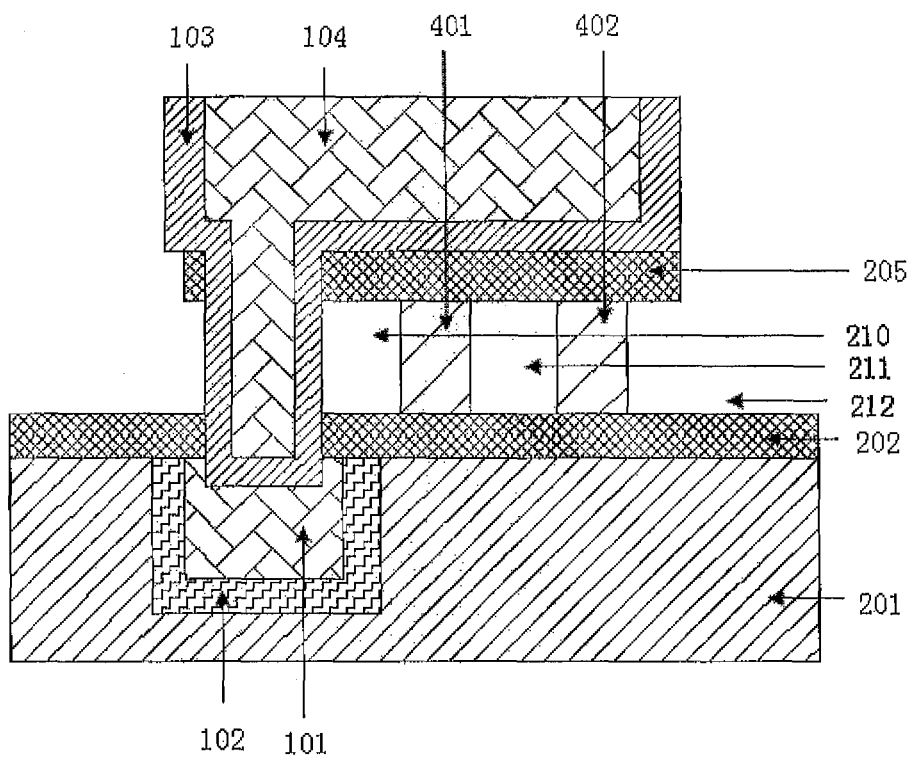

As shown in FIG. 6, etch the films 207 and 206, and part of the films 205 and 203, and the space generated after removing the films above is the complete air gap structures 210, 211 and 212 of the present invention.

The present invention can realize the complete air gap structure without short circuit or disconnection of copper conductors as well as the complete air gap structure with long wires, thus reducing RC delay.

The invention claimed is:

1. A structure for copper interconnection with a medium of low dielectric constant includes at least one metal conductor and a plurality of insulator supporting structures under each of the metal conductors, the said insulator supporting structures are used for supporting the respective metal conductors, wherein holes are configured between the metal conductors and also between the insulator supporting structures which are located under the same metal conductor and are used for supporting it.

2. The structure of claim 1, wherein the metal conductors are copper or tungsten wires or compound conductors made of copper or tungsten and a diffusion barrier layer.

3. The structure of claim 1, wherein the supporting insulator is under the supported metals to maintain their shape.

4. The structure of claim 3, wherein the insulator material is carbon silicon or polymer.

5. The structure of claim 1, wherein the insulator supporting structure is a columnar or strip structure made of insulation materials.

6. An integration method for interconnecting copper with the interconnecting structure of claim 1, wherein the method includes the following steps:
   providing a semiconductor substrate with microelectronic device;
   forming a first film composed of a first material on the substrate in sequence;
   forming a perforation opening in the first film;
   depositing and flattening a second film;
   depositing a third film and opening a second opening;
   depositing a fourth film and a fifth film on the third film;
   forming a damascene or dual-damascene copper interconnection structure;
   removing the fifth film, the fourth film, a part of the third film and the first film.

7. The integration method of claim 6, wherein the material of the second film is carbon silicon or polymer.

8. The integration method of claim 6, wherein the pore structure is formed after removing the media except the second and third films.

9. The integration method of claim 6, wherein the second and third films under the supported metals have a supporting effect so as to maintain the shape of the metals.

\* \* \* \* \*